(12) United States Patent
He et al.

(10) Patent No.: US 12,010,831 B2
(45) Date of Patent: Jun. 11, 2024

(54) 3D DRAM WITH MULTIPLE MEMORY TIERS AND VERTICALLY EXTENDING DIGIT LINES

(71) Applicant: Micron Technology, Inc., Boise, ID (US)

(72) Inventors: Yuan He, Boise, ID (US); Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/141,426

(22) Filed: Jan. 5, 2021

(65) Prior Publication Data

US 2022/0216218 A1   Jul. 7, 2022

(51) Int. Cl.
| | |
|---|---|
| *G11C 11/401* | (2006.01) |
| *G11C 11/4091* | (2006.01) |
| *G11C 11/4093* | (2006.01) |
| *G11C 11/4094* | (2006.01) |
| *G11C 11/4096* | (2006.01) |
| *H10B 12/00* | (2023.01) |

(52) U.S. Cl.
CPC ............ *H10B 12/50* (2023.02); *G11C 11/401* (2013.01); *G11C 11/4091* (2013.01); *G11C 11/4093* (2013.01); *G11C 11/4094* (2013.01); *G11C 11/4096* (2013.01); *H10B 12/30* (2023.02)

(58) Field of Classification Search
CPC ......... H01L 27/10897; H01L 27/10805; G11C 11/4091; G11C 11/4093; G11C 11/4094; G11C 11/4096
See application file for complete search history.

(56) References Cited

U.S. PATENT DOCUMENTS

| | | | | |
|---|---|---|---|---|
| 11,367,726 | B2* | 6/2022 | Lee | H01L 27/10826 |
| 2018/0218765 | A1* | 8/2018 | Derner | H01L 28/90 |
| 2019/0103406 | A1* | 4/2019 | Tang | H01L 27/1082 |
| 2019/0267074 | A1* | 8/2019 | Fishburn | G11C 11/4091 |
| 2019/0348424 | A1* | 11/2019 | Karda | H01L 27/11597 |
| 2020/0051614 | A1* | 2/2020 | Derner | G11C 11/4085 |
| 2020/0176465 | A1* | 6/2020 | Tang | H10B 43/27 |
| 2020/0185370 | A1* | 6/2020 | Juengling | G11C 11/4085 |
| 2020/0279601 | A1* | 9/2020 | Kim | H10B 12/03 |
| 2020/0286906 | A1* | 9/2020 | Karda | H10B 41/27 |

(Continued)

OTHER PUBLICATIONS

U.S. Appl. No. 17/079,745, filed Oct. 26, 2020, Lee et al.

*Primary Examiner* — Mushfique Siddique
(74) *Attorney, Agent, or Firm* — Wells St. John P.S.

(57) ABSTRACT

Some embodiments include an integrated assembly having a memory array over a base. The memory array includes a three-dimensional arrangement of memory cells. Sense amplifiers are associated with the base and are directly under the memory array. Vertically-extending digit lines pass through the arrangement of the memory cells and are coupled with the sense amplifiers. Some embodiments include an integrated assembly having a memory bank containing 64 memory chunks arranged in a 16×4 configuration. Some embodiments include an integrated assembly having a memory bank which contains 512 megabytes divided amongst 64 memory chunks which each have 8 megabytes. The 64 memory chunks are arranged in a configuration having multiple rows which each contain a two or more of the memory chunks.

33 Claims, 12 Drawing Sheets

(56) References Cited

U.S. PATENT DOCUMENTS

| | | | |
|---|---|---|---|
| 2021/0012828 A1* | 1/2021 | Kim | G11C 11/4097 |
| 2022/0059560 A1* | 2/2022 | Parekh | H10B 43/35 |
| 2022/0130834 A1* | 4/2022 | Lee | H01L 27/10879 |
| 2022/0320103 A1* | 10/2022 | Lee | H01L 27/10879 |
| 2022/0328249 A1* | 10/2022 | Yokoyama | H10B 12/50 |

* cited by examiner

3D DRAM WITH MULTIPLE MEMORY TIERS AND VERTICALLY EXTENDING DIGIT LINES

TECHNICAL FIELD

Memory arrays (e.g., DRAM arrays). Integrated assemblies comprising vertically-stacked decks.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. In operation, an electric field generated by voltage along the wordline may gatedly couple a bitline to the capacitor during read/write operations.

The memory cells described above may be incorporated into memory arrays. The data within the memory arrays may be logically subdivided amongst various units (banks, pages, sections, chunks, etc.) during operation of the memory arrays. An example memory bank 500 is described with reference to FIG. 1. The bank is associated with a planar array of memory cells. The bank has 65 chunks (units, portions), of which 64 include memory (specifically 8 megabytes, 8M, of memory), and of which one includes error-correcting-circuitry (ECC).

The ECC may include redundant memory cells which are to be utilized in a memory array in the event of failure of original memory cells of the memory array.

The term "8M" (or 8 MB) is generally understood to mean 8,388,608 bytes, as will be understood by persons of ordinary skill. Each byte may correspond to a single memory cell in applications in which each memory cell has two selectable and distinguishable memory states. A single memory cell may correspond to more than a single byte in applications in which the memory cell has more than two selectable and distinguishable memory states.

The 64 chunks together form a memory bank having 512M of memory. Such memory may be addressed utilizing a global input/output structure (GIO structure). The illustrated GIO structure spans the entire length of the memory bank 500.

Before further describing the access of data within the memory bank, it may be useful to describe the general relationship of a memory array within an integrated arrangement. FIG. 2 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O). Signals on the DQ PAD can represent values of information read from or to be written into the memory cells 1003. Other devices can communicate with the device 1000 through the I/O, the address lines 1009, or the control lines 1020 (CMD PAD). A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL to select signals on the first data lines 1006 and the second data lines 1013 that can represent the values of information to be read from or to be programmed into the memory cells 1003. The column decoder 1008 can selectively activate the CSEL signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

FIG. 3 shows a schematic illustration 2000 which diagrammatically describes some of the addressing (read/write operations) associated with the memory (e.g., memory cells 1003 of FIG. 2) within the memory array 1002. The bitlines 1006 are coupled with column-select/sense-amplifier (CS/SA) circuitry 2002, and information passes to/from the memory utilizing the CS/SA circuitry. Information associated with the CS/SA circuitry is accessed with local input/output structures (LIO structures) 2004, which pass signals $LIO_0$-$LIO_n$ to/from a local LIO circuit 2006. A GIO structure 2008 (e.g., a GBUS) passes signals to/from a circuit block 2010 comprising READ/WRITE (R/W) circuitry. Specifically, the block 2010 includes a READ block 2012 and a WRITE block 2014. The long GIO structure associated with the extended bank 500 of FIG. 1 may lead to a significant loss of signal-to-noise along the GIO structure, requiring the illustrated sense amplifier 2016 at the early stage of the READ block to boost the signal in the GIO to full up or full down. The sense amplifier 2016 may be a direct sense amplifier (DSA) which compares an electrical signal (voltage) of the GIO to that of a reference voltage source.

An input/output (I/O) block 2020 is in data communication with the R/W circuitry of the block 2010. Information may be passed between the I/O of the block 2020 and the RAY circuitry of the block 2010 with a Data Transfer Bus 2018.

A continuing goal of integrated circuit (IC) design is to increase the level of integration, and thus to conserve the valuable semiconductor real estate associated with a semiconductor die. It is desired to develop highly-integrated memory, and to develop highly-integrated circuits suitable for addressing the memory.

DETAILED DESCRIPTION OF THE
ILLUSTRATED EMBODIMENTS

Some embodiments include integrated assemblies having a memory array which includes vertically-displaced memory tiers, Vertically-extending digit lines may extend through the tiers. A semiconductor base may be under the memory array. Sensing circuitry may be provided within the base, and may be directly under the memory array. Memory cells of the memory array, together with sensing circuitry under the memory array, may be incorporated into highly-integrated memory banks. Example embodiments are described with reference to FIGS. 4-12.

Figure 4:
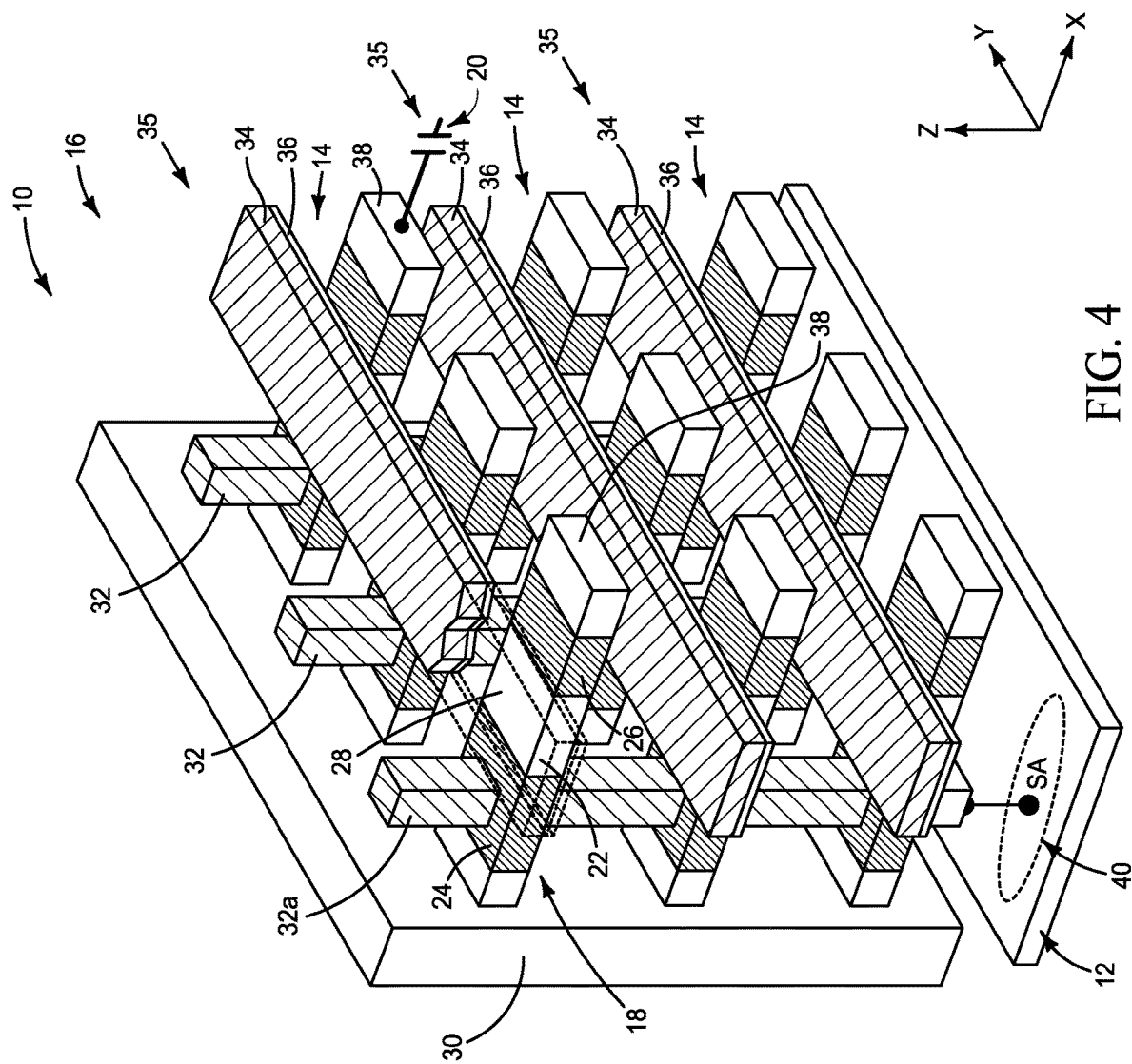
FIG. 4 is a diagrammatic three-dimensional view of a region of an example integrated assembly having a memory array which extends across multiple vertically-displaced tiers.

Referring to FIG. 4, an integrated assembly 10 includes memory cells 14 (only some of which are labeled) arranged in a three-dimensional array 16. An x, y, z coordinate system is provided adjacent to the region of the assembly 10 to assist in describing relative directions of various structures shown in the assembly 10.

Each of the memory cells comprises an access device 18 (only one of which is labeled) coupled with a storage element 20 (only one of which is shown in order to simplify the drawing).

In the illustrated embodiment, the access devices 18 correspond to horizontally-extending transistors, with each of the transistors comprising a channel region 22 between a pair of source/drain regions 24 and 26.

The channel regions and source/drain regions may be formed within semiconductor material 28. The semiconductor material 28 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

The source/drain regions 24 and 26 may correspond to heavily-doped regions formed within the semiconductor material 28.

In the illustrated embodiment, the semiconductor material 28 extends to a conductive plate 30. The conductive plate 30 may be utilized to drain excess carriers (e.g., holes) from body regions (channel regions) of the transistors 18 in some operational states.

Vertically-extending digit lines 32 are along columns of the memory array 16, and are coupled with the source/drain regions 24.

Horizontally-extending wordlines 34 extend along rows of the memory array 16 and are operatively proximate to the channel regions 22.

The wordlines 34 extend along an illustrated y-axis direction, and the digit lines 30 to extend along an illustrated z-axis direction. The vertically-extending digit lines 32 may be orthogonal to the wordlines 34, or at least substantially orthogonal to such wordlines (with the term "substantially orthogonal" meaning orthogonal to within reasonable tolerances of fabrication and measurement). In some embodiments, the digit lines 32 may extend along a direction which is within about 10° of being orthogonal to the wordlines 34.

The wordlines 34 may be considered to comprise gating regions operatively adjacent to the channel regions 22 of the transistors 18 so that the source/drain regions 24 and 26 of the individual transistors 18 are gatedly coupled to one another. When the term "gated coupling" is utilized herein, such may refer to the controlled coupling/decoupling of the source/drain regions 24 and 26 from one another that may be induced by electrical activation/deactivation the wordlines 34.

The gating regions along the wordlines 34 are spaced from the channel regions 22 by gate dielectric material 36. The gate dielectric material may comprise any suitable composition(s), and in some embodiments may comprise, consist essentially of, or consist of silicon dioxide.

The wordlines 34 may extend to wordline-driver-circuitry (e.g., sub-wordline-driver, SWD, units) outside of the illustrated region of the assembly 10. Staircase regions may be laterally adjacent to the memory array 16, and may be utilized for coupling individual wordlines with specific SWD units.

The wordlines 34 may be considered to be arranged within vertically-stacked tiers (levels) 35.

Conductive nodes 38 (only a couple of which are labeled) are adjacent to the source/drain regions 26, and couple such source/drain regions with the storage elements 20. In some embodiments, the conductive nodes 38 may be considered to be part of the storage elements 20.

The storage elements 20 may be any suitable devices having at least two detectable states; and in some embodiments may be, for example, capacitors, resistive-memory devices, conductive-bridging devices, phase-change-memory (PCM) devices, programmable metallization cells (PMC), etc. In the illustrated embodiment, the storage elements 20 correspond to capacitors.

In operation, the wordlines 34 may be utilized for selectively coupling a capacitor 20 with a digit line 32 during the addressing (READ/WRITE operation) of a memory cell 14. Each of the memory cells 14 may be considered to be uniquely addressed utilizing one of the digit lines 32 in combination with one of the wordlines 14.

A sense amplifier (SA) 40 is diagrammatically illustrated to be under the array 16 and coupled with one of the vertically-extending digit lines 32 (with such one of the vertically-extending digit lines being labeled as 32a). The sense amplifier may be associated with a base 12 which is under the memory array 16. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The sense amplifier 40 may be utilized during READ/WRITE operations associated with the memory cells along the digit line 32a.

Figure 5:
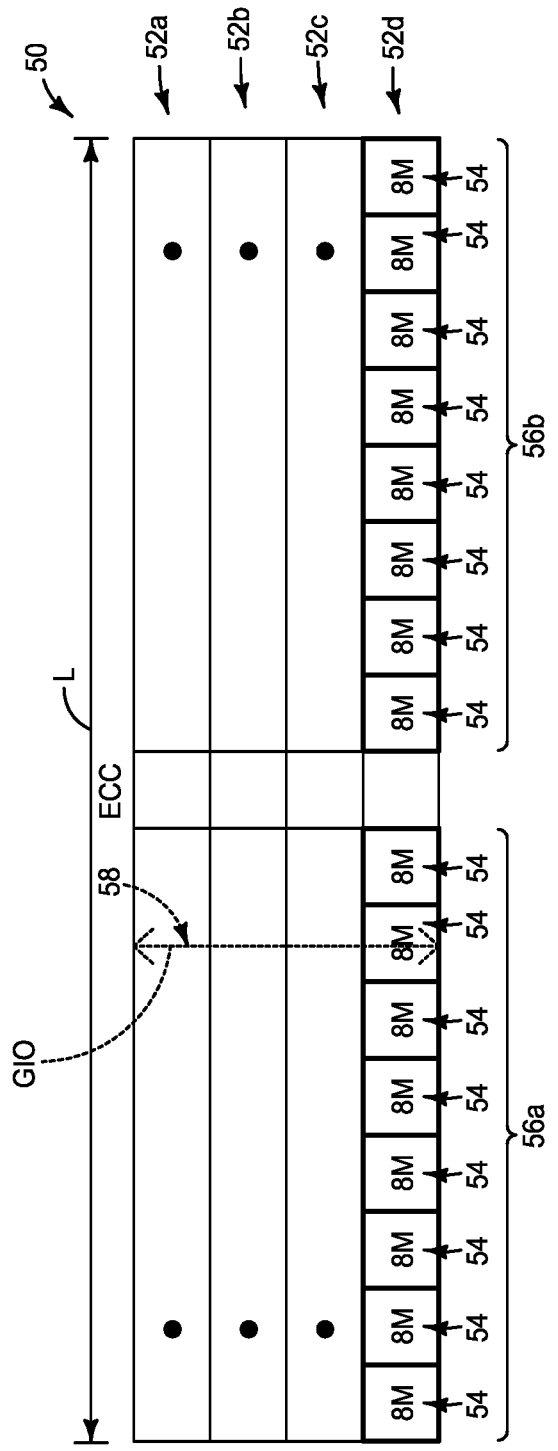
FIG. 5 is a top-down view of an example memory bank.

Some embodiments include memory bank configurations which can take advantage of vertically-extending digit lines within a memory array (e.g., the memory array 16 of FIG. 4). FIG. 5 shows an example memory bank 50. The memory bank includes four rows (sections) 52a-d, with each of the rows comprising 16 memory chunks (units, portions) 54. Only the memory chunks 54 within the first row 52a are shown, but it is to be understood that similar memory chunks are within the rows 52b-c.

Each of the memory chunks comprises 8 megabytes (8M) of memory. In some embodiments, the memory bank configuration of FIG. 5 may be referred to as a 16×4 configuration in that it comprises 16 memory chunks along a row direction (an illustrated x-axis direction) and four chunks along a column direction (an illustrated y-axis direction). It is noted that the x and y axis directions of FIG. 5 may or may not be the same as the x and y axis directions of FIG. 4.

The 16×4 configuration of FIG. 5 comprises 64 of the memory chunks 54. Since each of the memory chunks comprises 8M, the configuration of FIG. 5 comprises 512M of memory (64*8). Alternately, the total memory within the configuration of FIG. 5 may be determined to be 512M by considering the bank 50 to comprise 8M/chunk, 16 chunks per section, and 4 sections; and thus to comprise 8*16*4=512M).

The illustrated configuration of FIG. 5 may be considered to comprise the 16 memory chunks 54 within a common row as one another (e.g., row 52a) to be along a length L of the memory bank 50. In the illustrated embodiment, the 16 memory chunks within each row are subdivided into a first set 56a comprising eight of the memory chunks, and a second set 56b comprising the other eight of the memory chunks. Error-correcting-circuitry (ECC) is provided between the first and second sets 56a and 56b.

Figure 1:
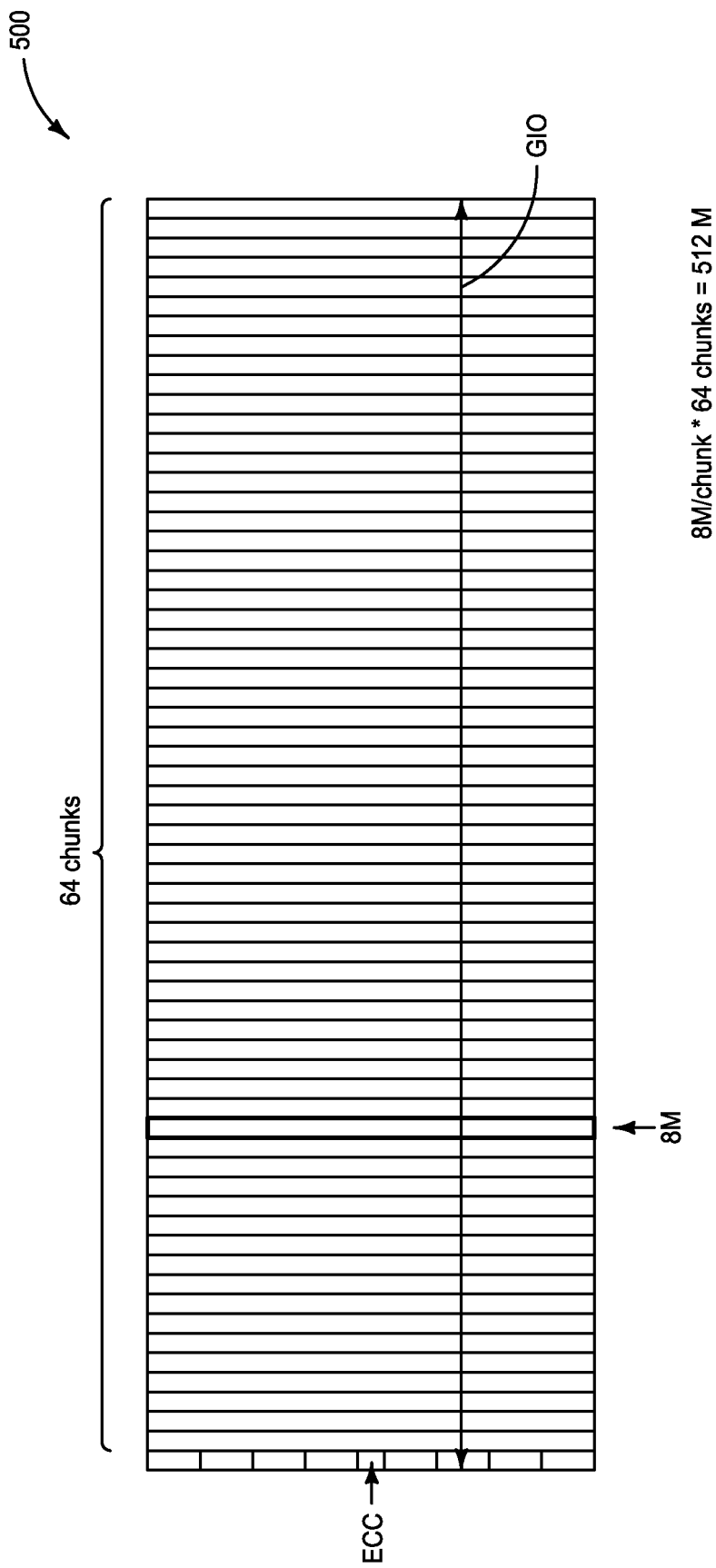
FIG. 1 is a top-down view of a prior art memory bank.
Figure 2:
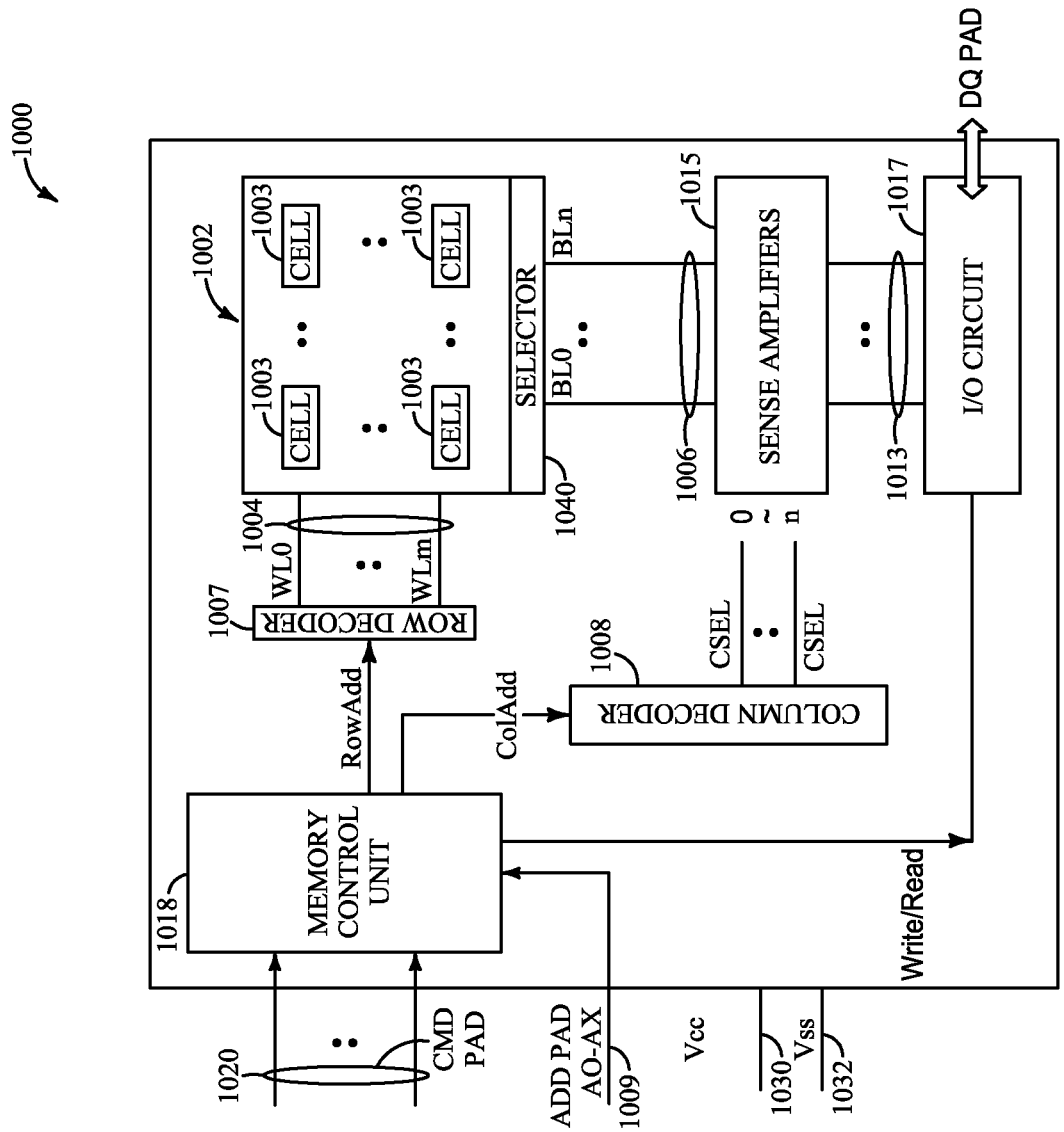
FIG. 2 shows a block diagram of a prior art arrangement comprising a memory array.

FIG. 5 shows that a global input/output (GIO) structure 58 extends across the memory chunks 54. FIG. 1 shows that a conventional GIO structure associated with planar memory is a long structure which extends linearly across 64 side-by-side chunks. In contrast, the GIO structure 58 of FIG. 5 is a relatively short structure which extends only across four sections (52a-d), and across the 16 chunks 54 within each of the sections.

The GIO structure 58 may be in any suitable location relative to the chunks 54, and in some embodiments may be above (over) the chunks 54 as described in more detail below.

Although the memory bank 50 of FIG. 5 comprises four rows with 16 memory chunks per row, in other embodiments the memory bank may have other configurations. Generally, an example memory bank may comprise 512M (i.e., 512 megabytes) divided amongst 64 memory chunks, with each chunk comprising 8M. The 64 memory chunks may be arranged in a configuration having multiple rows (sections), with each row (section) comprising a plurality of the memory chunks. For instance the memory banks may be arranged in configurations having two rows which each comprise 32 of the memory chunks, four rows which each comprise 16 of the memory chunks (as shown in FIG. 5), eight rows which each comprise eight of the memory chunks, etc. Generally, all of the rows will comprise the same number of memory chunks as one another.

Figure 6:
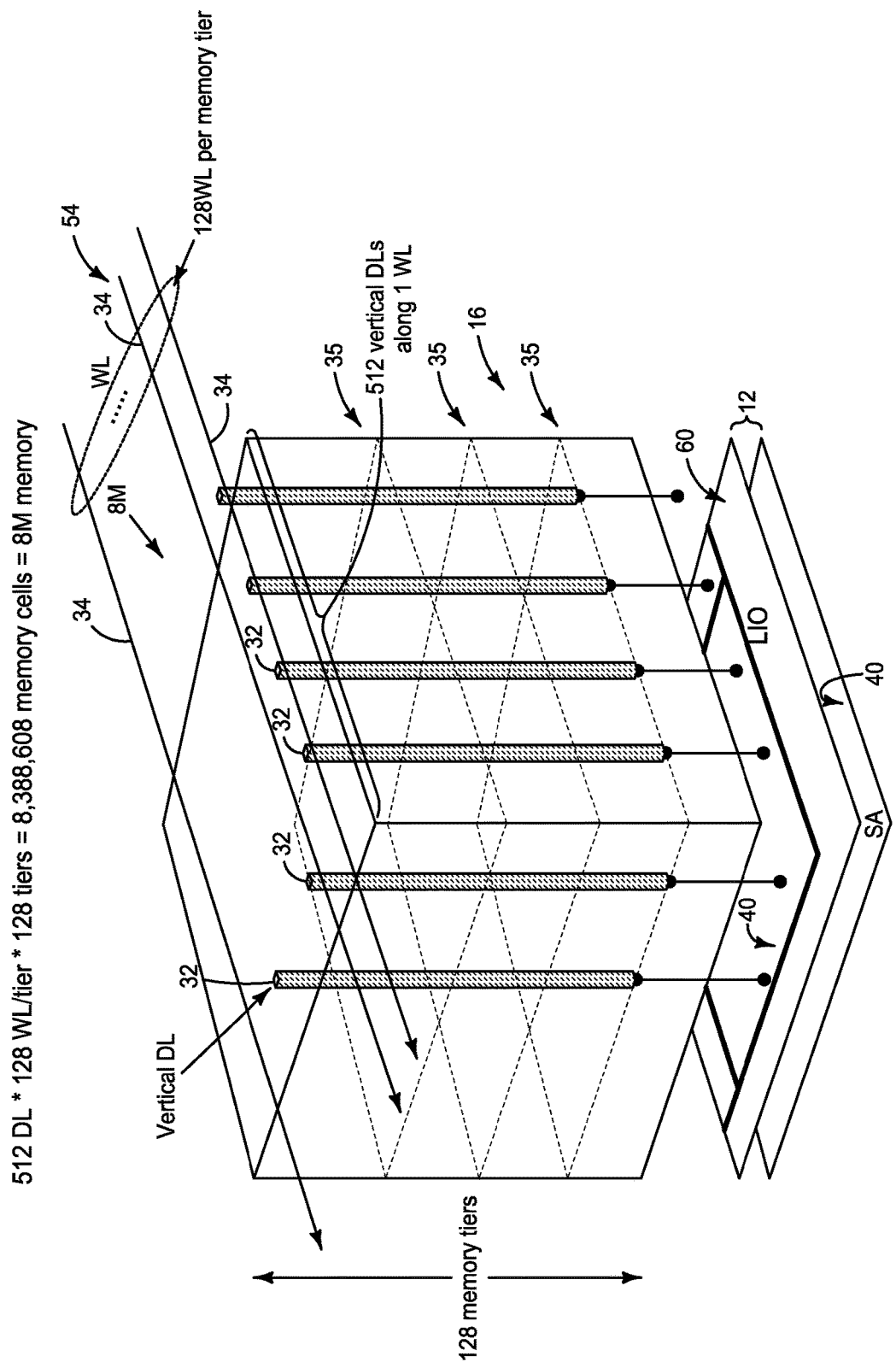
FIG. 6 is a diagrammatic three-dimensional view of a region of the example memory bank of FIG. 5.

FIG. 6 diagrammatically illustrates a representative one of the 8M chunks 54 in three-dimensional view. The chunk comprises the memory array 16 over the base 12.

The vertically-extending digit lines (DLs) 32 extend through the array 16, with only a few of such digit lines being diagrammatically illustrated. In practice, there may be 512 of the vertically-extending digit lines associated with each wordline within the illustrated chunk 54.

A few of the wordlines 34 are shown within the array 16 of FIG. 6, and locations of some of the tiers 35 are diagrammatically illustrated. The tiers 35 may be referred to as memory tiers (or as tiers of memory cells). In some embodiments, each of the tiers 35 may comprise 128 wordlines (WL), and there may be 128 of the memory tiers 35. Accordingly, there may be 16,384 (128*128) wordlines within the array 16 of the chunk 54. If the array comprises 512 of the digit lines along the wordlines, then the array may comprise 8,388,608 memory cells (16,384*512); with 8,388,608 memory cells being understood to be 8M memory cells in conventional jargon. Each memory cell may correspond to a byte of memory, and accordingly the chunk 54 may comprise 8 megabytes (8M) of memory.

The base 12 associated with the memory chunk 54 of FIG. 6 is shown to comprise local input/output (LIO) circuitry 60, and sense amplifier (SA) circuitry 40. The LIO circuitry 60 and SA circuitry 40 are shown as regions (boxes) in FIG. 6 to simplify the drawing, and are described in more detail below. The digit lines 32 of FIG. 6 are shown to be coupled with the sense-amplifier-circuitry 40, and to extend upwardly from the base 12 comprising the sense-amplifier-circuitry.

The base may comprise numerous other components besides the sense-amplifier circuitry and the local input/output circuitry, and may, for example, comprise column-select-circuitry, switches, wiring, etc.

Figure 7:
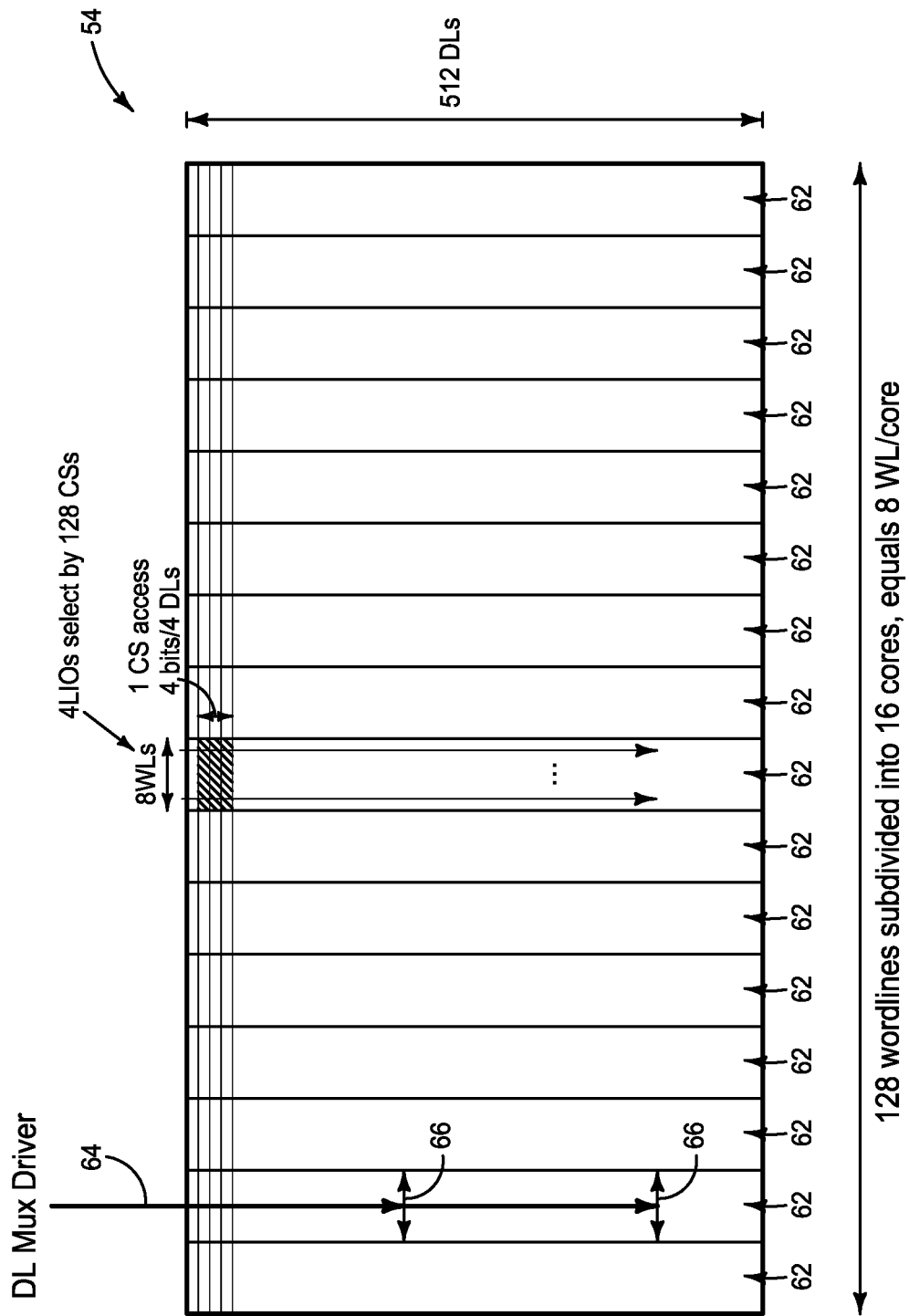
FIG. 7 is a diagrammatic top-down view of an example memory chunk.

FIG. 7 is another diagrammatic representation of one of the memory chunks 54, and shows that the wordlines within such chunk may be subdivided amongst 16 cores 62. If there are 128 wordlines associated with the memory chunk 54, then each of the cores may comprise eight of the wordlines.

The local input/output (LIO) circuitry associated with the memory chunk 54 may include four local interconnects (LIOs), and may serve 512 digit lines. The digit lines within each of the cores 62 may be accessed with a multiplexer (MUX) driver 64 (DL Mux Driver). The DL Mux driver 64 is diagrammatically illustrated to extend to local connections 66 that extend laterally across the core 62 to connect with groups of the digit lines 32 (with the digit lines 32 not being individually shown in the diagram of FIG. 7).

Figure 8:
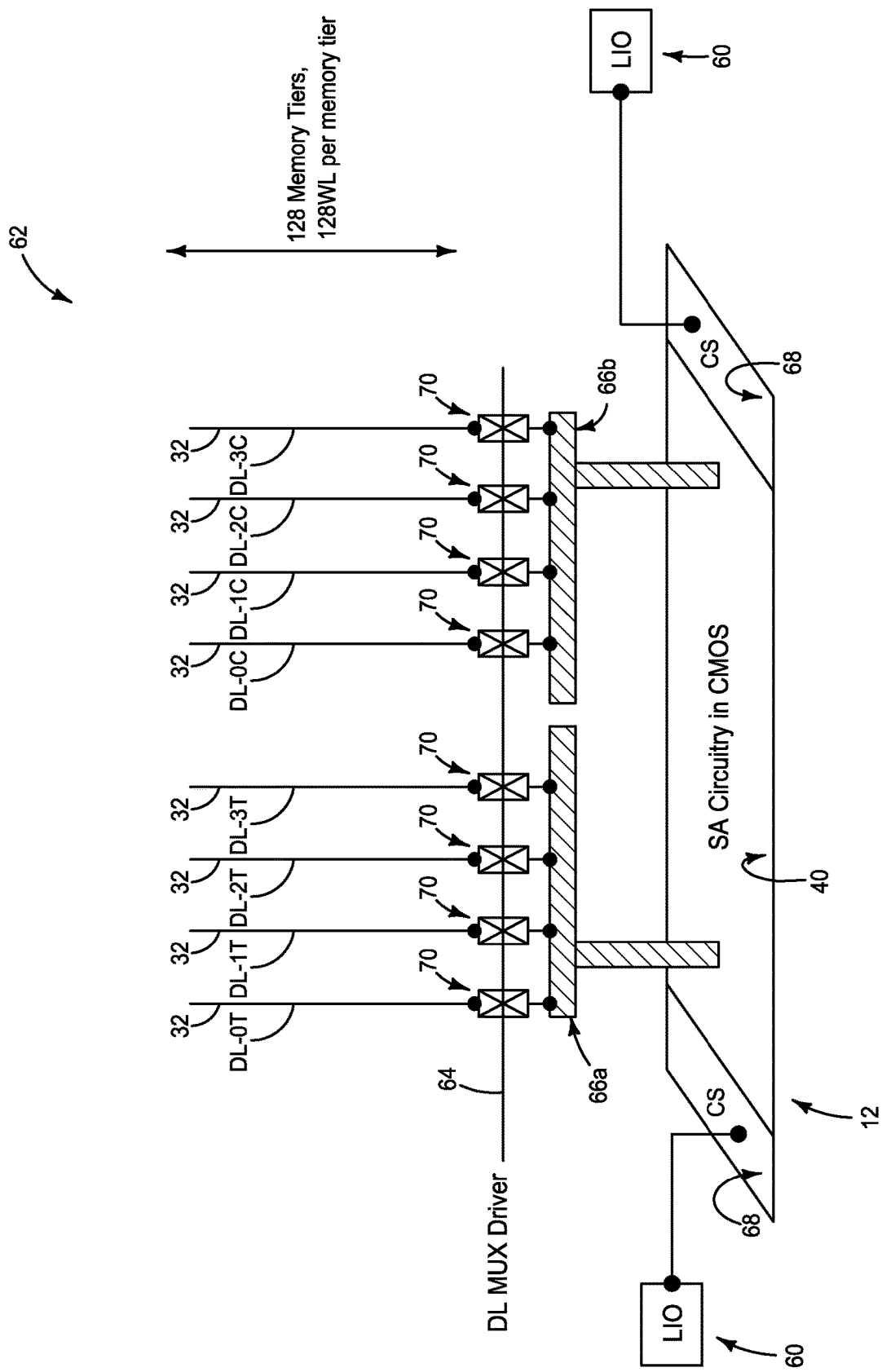
FIG. 8 is a diagrammatic three-dimensional view of an example arrangement of example circuitry across a segment of the example region of FIG. 7.

FIG. 8 diagrammatically illustrates a region of the Mux Driver 64 relative to one of the cores 62. The digit lines 32 are shown to extend to conductive interconnects 66a and 66b which are coupled with the sense-amplifier-circuitry 40. The sense-amplifier-circuitry may comprise a region of CMOS associated with the base 12.

Column-select-circuitry (CS) 68 is shown to be laterally outward of the sense-amp-circuitry 40, and to be coupled with the LIO circuitry 60. In operation, data may pass to/from memory cells associated with the digit lines 32 utilizing the LIO circuitry 60, the sense-amplifier-circuitry 40, and the column-select-circuitry 68.

The digit lines 32 may comprise comparative sets of first and second digit lines, and are shown to be arranged in pairs of comparatively coupled lines. Specifically, the digit lines are labeled as DL-0T, DL-1T, DL-2T, DL-3T, DL-0C, DL-1C, DL-2C and DL-3C. The digit lines with a "T" in the label (e.g., DL-0T) are "true" digit lines, and the digit lines with "C" in the label are complementary digit lines. Each of the true digit lines is paired with one of the complementary digit lines having the same label as the true digit line but for the "T" or "C" component (e.g., DL-0T and DL-0C are paired together). The paired true and complementary digit lines are comparatively compared with one another with the sense-amplifier-circuitry 40. Each pair of true and complementary digit lines may be considered to be a comparative set which includes a first comparative digit line and a second comparative digit line. For instance, the digit lines DL-0T and DL-0C may be considered to be first and second comparative digit lines, respectively, within a first comparative set.

For purposes of understanding this disclosure and the claims that follow, a first digit-line is "comparatively coupled" with a second digit-line through sense-amplifier-circuitry if the sense-amplifier-circuitry is configured to compare electrical properties (e.g., voltage) of the first and second digit-lines with one another. It is noted that the terms "true" and "complementary" are arbitrary as utilized to label digit lines, and are simply used to differentiate the digit-lines which are compared to one another through sense-amplifier-circuitry.

The Mux driver 64 extends to Mux circuitry 70 utilized to selectively address individual digit lines 32. The Mux circuitry 70 may comprise any suitable configuration, and may, for example, comprise multiple transistors (and/or other suitable switches) configured to enable selective access of specific digit lines.

The sense-amplifier-circuitry 40 may be considered to comprise a plurality of individual sense amplifiers. The Mux driver 64 and Mux circuitry 70 may be utilized to enable multiple sets of digit lines to be coupled with a single sense amplifier. Such may reduce the number of sense amplifiers utilized within the base 12 as compared to applications in which each pair of digit lines is coupled with a unique and separate sense amplifier. Accordingly, the utilization of the Mux driver 64 and Mux circuitry 70 may reduce an overall footprint of semiconductor real estate consumed by the sense amplifiers. In alternative embodiments relative to the embodiment of FIG. 8, each of the paired sets of digit lines may be coupled with an individual sense amplifier, and accordingly the Mux driver and Mux circuitry of FIG. 8 may be omitted.

The Mux Driver 64 may extend to control circuitry (not shown). Such control circuitry may be in any suitable location, and in some embodiments may be laterally offset from the memory bank 50 of FIG. 5.

Figure 9:
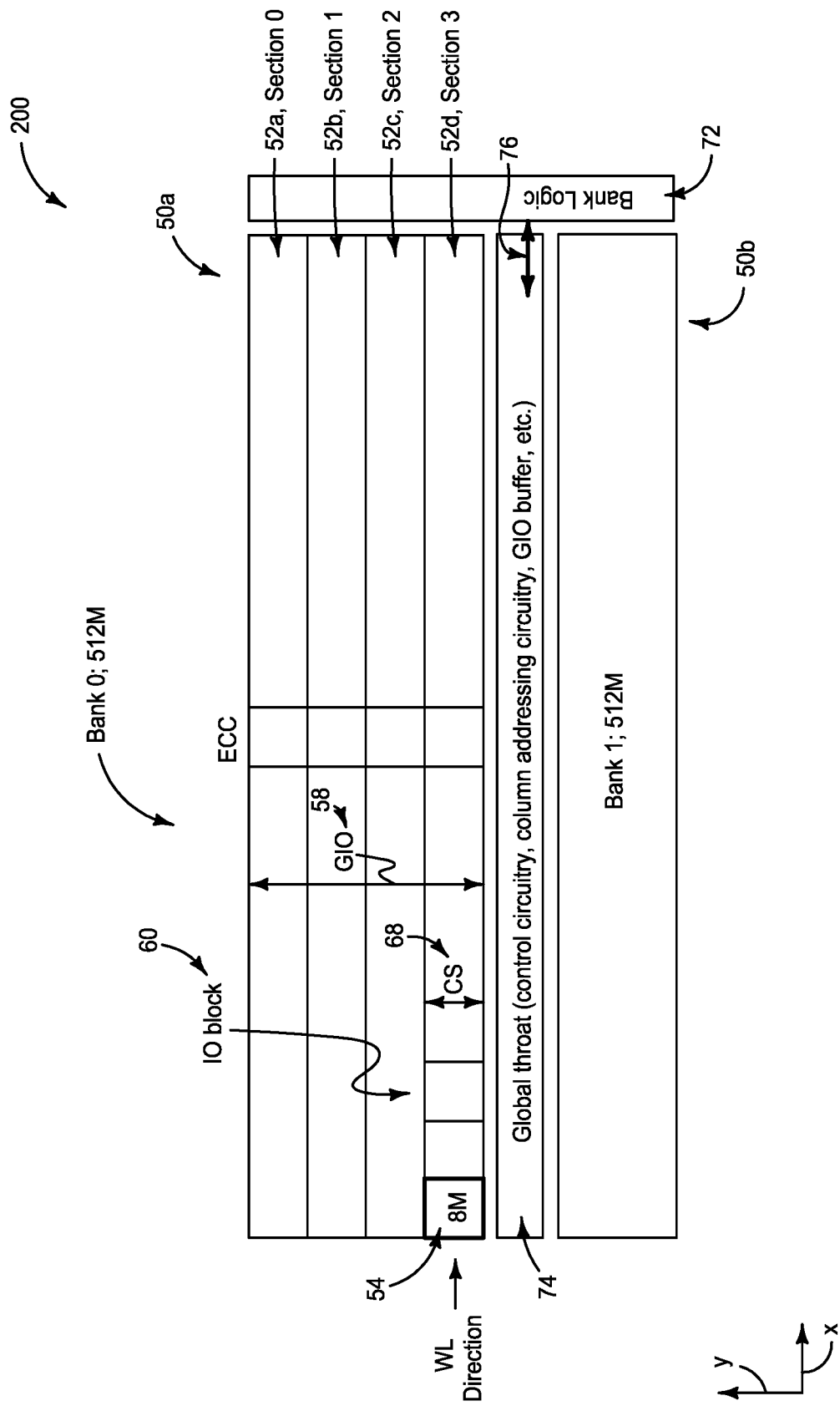
FIG. 9 is a top-down view of an example memory bank.

The memory bank 50 may be representative of a large number of memory banks provided across a semiconductor die. In some embodiments, such die may be incorporated into an integrated circuit package (e.g., a memory chip). FIG. 9 shows a region of an assembly 200 comprising a pair of adjacent memory banks 50*a* and 50*b* (Bank 0 and Bank 1). The banks may be substantially identical to one another, and may both comprise the same amount of memory as each other (e.g., both may comprise 512 M, as shown). Each bank may be understood to correspond to a region associated with memory which is accessed independently relative to memory associated with the other of the bank.

The bank 50*a* is shown to comprise the sections 52*a-d* described above with reference to FIG. 5, with such sections being labeled Section 0, Section 1, Section 2 and Section 3, respectively. Each section may comprise a single page of memory, or may comprise multiple pages of memory. The memory chunks 54 (only some of which are shown) each comprises a single LIO block 60. Column-select-circuitry (CS) 68 is shown to extend across the widths of the indicated sections (with the widths being dimensions of the sections 52*a-d* along the illustrated y-axis direction), and the GIO 58 is shown to extend across the entire width of the memory bank 50*a* (with such width being the dimension of the bank 50*a* along the illustrated y-axis direction).

A region 72 is adjacent to the banks 50*a* and 50*b*, and is indicated to comprise "Bank Logic". The "Bank Logic" may include, for example, COLUMN DECODER circuitry, ROW DECODER circuitry, etc. The region 72 may be referred to as a throat or socket. In some applications, a "throat" may be understood to be a region (location, place) for control circuits, and a "socket" may be understood as a region (location, opening) utilized to feed signals through a level to circuitry above or below the level. For purposes of understanding this disclosure and the claims that follow, the term "socket" is to be understood to be generic for sockets and throats unless explicitly stated otherwise.

A region 74 is between the memory banks 50*a* and 50*b*. A double-headed arrow 76 is utilized to show that circuitry within the region 74 may be in data communication with the circuitry in the Bank Logic region 72. The region 74 may be referred to as a global throat (i.e., may comprise circuitry shared between the banks 50*a* and 50*b*). The circuitry provided within the region 74 may include, for example, control circuitry, column addressing circuitry, a GIO buffer, etc.

Figure 10:
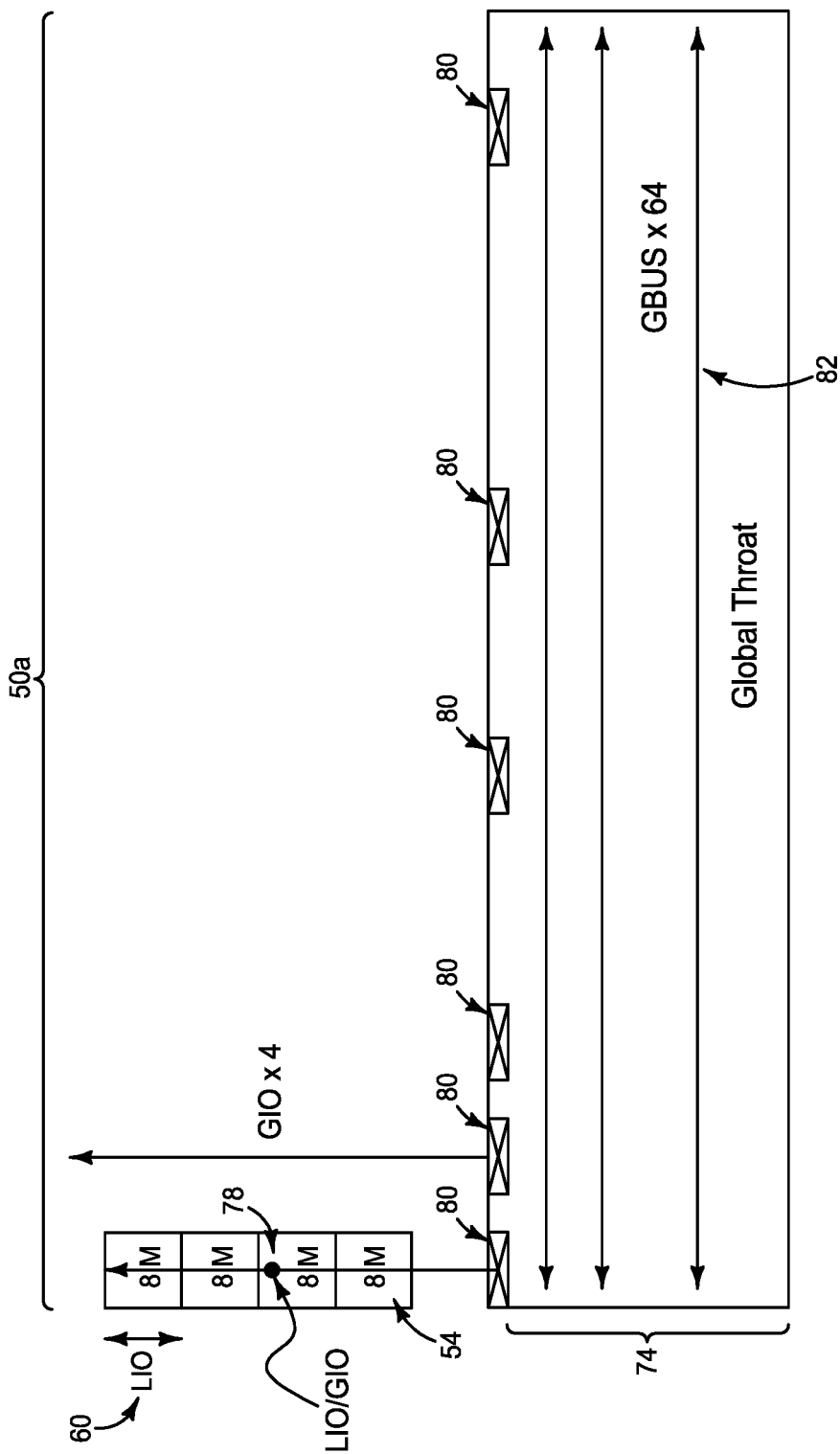
FIG. 10 diagrammatically illustrates an arrangement comprising circuitry for addressing memory within the memory bank of FIG. 9.

FIG. 10 diagrammatically illustrates datapath architecture which may be associated with the memory bank 50*a* and the global throat 74 of FIG. 9. Such architecture includes GIO circuitry extending across the sections 52*a-d* (with such sections being shown in FIG. 5), and there are four paths associated with the GIO circuitry extending across columns of the memory chunks 54 and utilized to address each of the four sections 52*a-d*. LIO circuitry 60 extends across the memory chunks 54. A region where the LIO interacts with the GIO is indicated as a region 78 within one of the memory chunks 54. The GIO is shown to extend to multiplexer (MUX) regions 80 within the global throat 74. There may be a GIO and an associated Mux region for each of the 16 columns of the memory chunks 54 (such 16 columns may be understood as the columns with reference to FIG. 5 as corresponding to columns of the chunks 54 extending along the y-axis direction). A Mux Driver (not shown) may extend to the Mux regions 80 and be utilized for controlling operation of the GIO paths associated with the Mux regions. The Mux Driver may be coupled with appropriate control circuitry. A bus (GBUS) 82 extends across the global throat and is in data can communication with the GIO paths. The GBUS is configured to pass data signals to and from the 64 memory chunks within the memory bank 50*a*.

Figure 11:
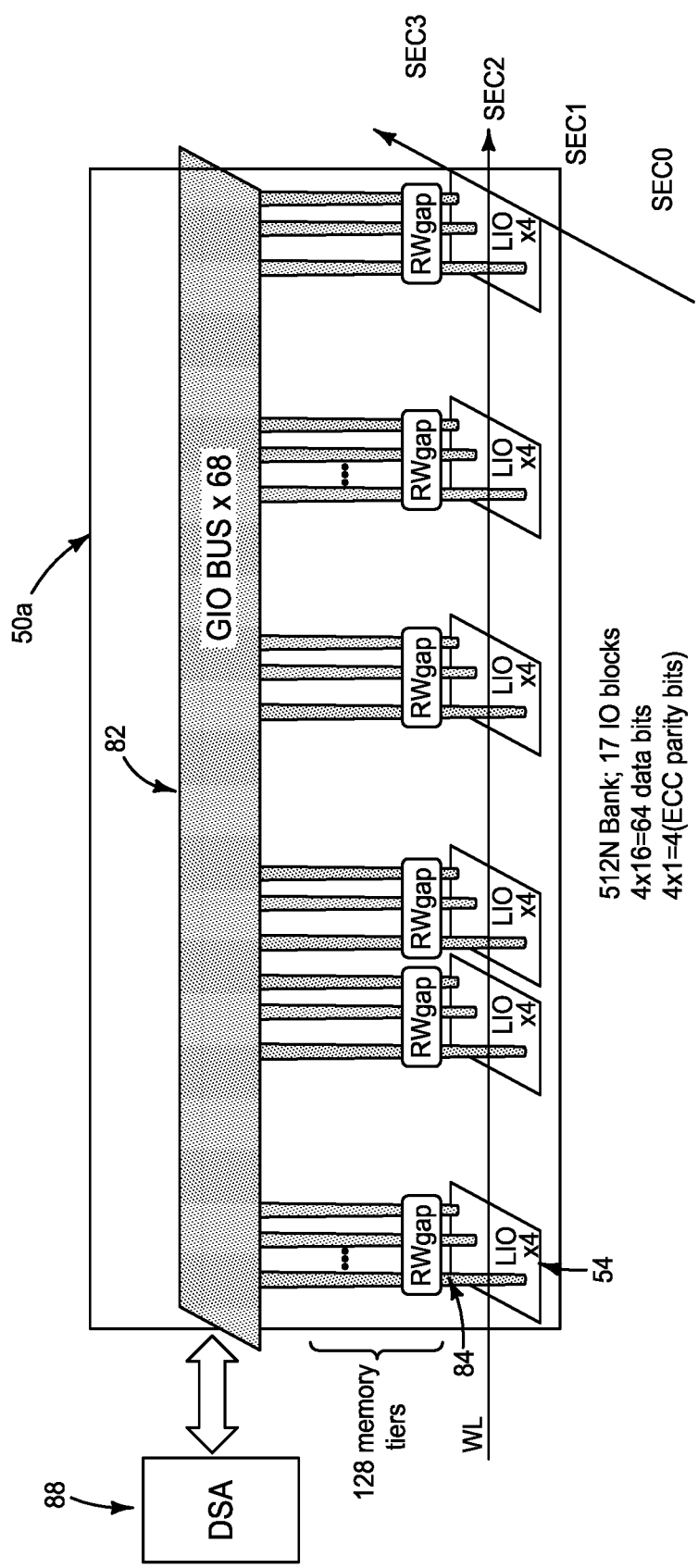
FIG. 11 is a diagrammatic three-dimensional view of an example arrangement of example circuitry across the example memory bank of FIG. 9.

FIG. 11 shows an example physical arrangement of datapaths relative to a region of the memory bank 50*a*. There are four LIO regions within each of the memory chunks 54. The LIO regions are beneath the memory array 16. In the shown embodiment, the GBUS 82 (shown as a GIO BUS) is above the memory array 16. Interconnects 84 (datapaths) extend between the GIO Bus and the LIO regions. The interconnects 84 may extend through and/or around the array 16, and are configured to carry signals vertically past the array 16.

In the illustrated embodiment, the GBUS 82 is coupled with a sense amplifier 88 (DSA) to bump up a signal form the GBUS in the event that there is excessive signal loss as information is transferred along the GBUS.

Figure 3:
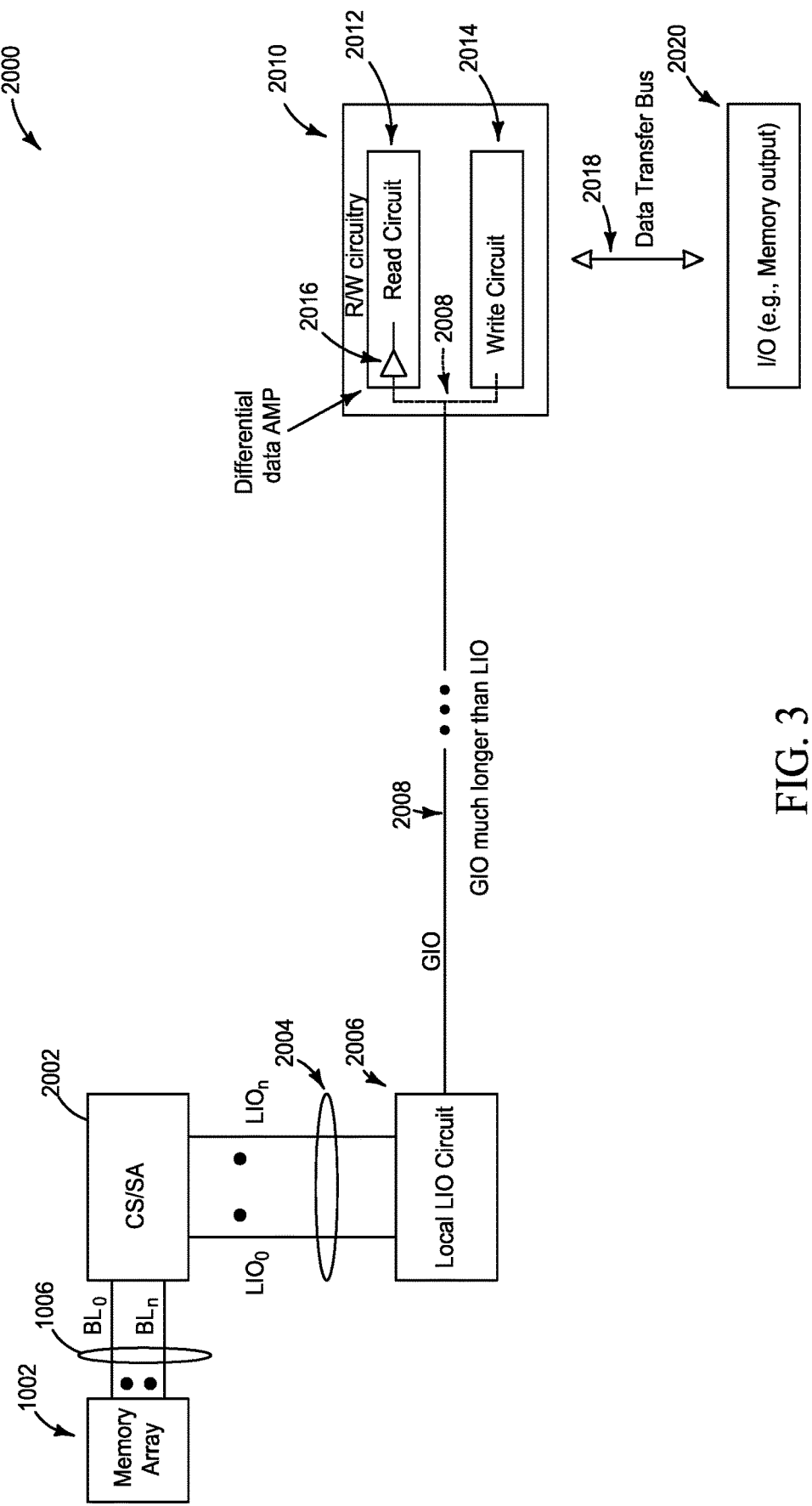
FIG. 3 diagrammatically illustrates a prior art arrangement comprising circuitry for addressing memory of a memory array.

The DSA 88 may be a sense amplifier having a reference voltage for comparing with the GBUS, and may be analogous to the amplifier 2016 described above with reference to the prior art configuration of FIG. 3. The DSA 88 may be optional in some embodiments due to the short GBUS that may be utilized in embodiments described herein. If the DSA is omitted, such may simplify fabrication of an integrated circuit, and may reduce the overall footprint of the integrated circuit. In some applications, the DSA may be replaced with one or more inverters and/or a buffer.

Figure 12:
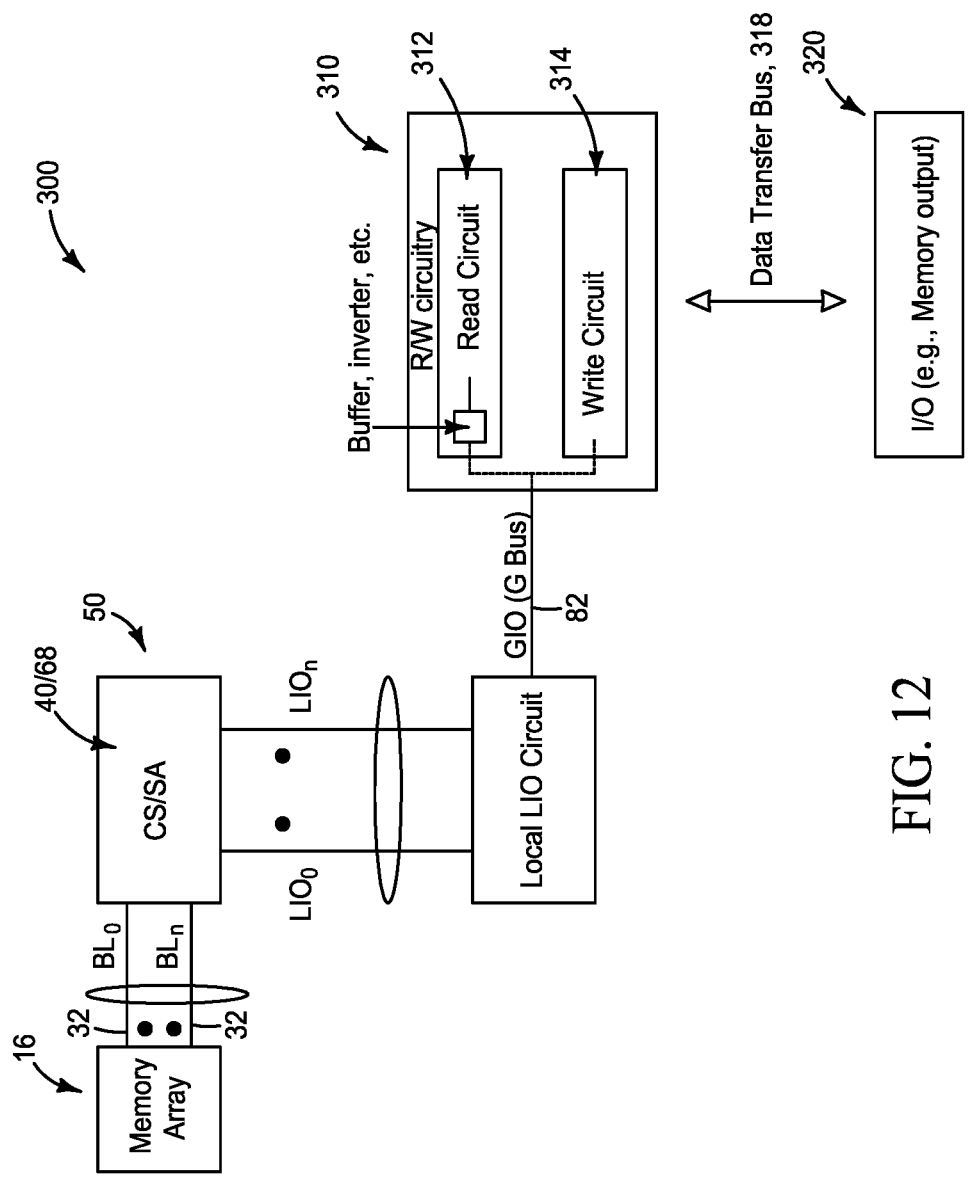
FIG. 12 diagrammatically illustrates an example arrangement comprising circuitry for addressing memory.

FIG. 12 shows a schematic illustration 300 which diagrammatically describes some of the addressing (read/write operations) associated with the memory bank 50. The bitlines 32 are coupled with column-select/sense-amplifier (CS/SA) circuitry 40/68, and information (data) passes to/from memory utilizing the CS/SA circuitry and the bitlines. Information associated with the CS/SA circuitry is accessed with local input/output structures (LIO structures), which pass signals $LIO_0$-$LIO_n$ to/from a local LIO circuit. The GBUS 82 passes signals to/from a circuit block 310 comprising READ/WRITE (R/W) circuitry. Specifically, the block 310 includes a READ block 312 and a WRITE block 314. Unlike the prior art embodiment of FIG. 3, there is no sense amplifier at the early stage of the READ block to boost the signal of the GBUS to full up or full down. Instead, the signal-to-noise in the GBUS may be sufficiently high that no substantial signal boost is needed. In some embodiments, one or both of inverter-driver-circuitry and/or buffer-circuitry may be provided in place of the sense amplifier 2016 of the prior art configuration of FIG. 3.

An input/output (I/O) block 320 is in data communication with the R/W circuitry of the block 310. Information may be passed between the I/O of the block 320 and the R/W circuitry of the block 310 with a Data Transfer Bus 318.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "page", "section", "chunk" and "bank" are utilized herein, and may be understood to have conventional meanings relative to memory storage applications unless expressly stated otherwise.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow. The terms "couple, coupling, coupled, etc." may refer to electrical connections.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory array over a base. The memory array includes a three-dimensional arrangement of memory cells. Sense amplifiers are associated with the base and are directly under the memory array. Vertically-extending digit lines pass through the arrangement of the memory cells and are coupled with the sense amplifiers.

Some embodiments include an integrated assembly having a memory bank containing 64 memory chunks arranged in a 16×4 configuration.

Some embodiments include an integrated assembly having a memory bank which contains 512 megabytes divided amongst 64 memory chunks which each have 8 megabytes. The 64 memory chunks are arranged in a configuration having multiple rows which each contain a plurality of the memory chunks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a memory array over a base; the memory array comprising a three-dimensional arrangement of memory cells;
   sense amplifiers associated with the base and being directly under the memory array;
   vertically-extending digit lines passing through source/drain regions of the memory cells and being coupled with the sense amplifiers;
   wherein each source/drain region comprises an area in a horizontal cross section substantially larger than an area of each digit line in the horizontal cross section; and
   wherein the memory cells include horizontally-extending access devices coupled with storage elements.

2. The integrated assembly of claim 1 wherein the memory array includes 128 vertically-stacked tiers of the memory cells and wherein the memory array comprises 128 wordlines associated with each of the individual tiers of the memory cells.

3. The integrated assembly of claim 1 wherein the digit lines are subdivided amongst comparative sets, with each of the comparative sets comprising a first comparative digit line and a second comparative digit line comparatively coupled to the first comparative digit line through one of the sense amplifiers.

4. The integrated assembly of claim 3 wherein multiple of the comparative sets of the digit lines are coupled with a single one of the sense amplifiers.

5. The integrated assembly of claim 1 wherein the access devices are the transistors.

6. The integrated assembly of claim 1 wherein the storage elements are capacitors.

7. The integrated assembly of claim 1 wherein the storage elements comprise at least one of the following:
   resistive-memory devices, conductive-bridging devices, phase-change-memory devices, and programmable metallization cells.

8. The integrated assembly of claim 1 wherein the vertically-extending digit lines extend directly through source/drain regions of transistors in the memory cells.

9. The integrated assembly of claim 1 further comprising a conductive plate extending vertically along the three-dimensional arrangement of memory cells.

10. The integrated assembly of claim 9 wherein the conductive plate is configured to drain excess carriers from the channel regions of transistors.

11. The integrated assembly of claim 1 wherein an entirety of the structure for the vertically-extending digit lines extend only vertically.

12. The integrated assembly of claim 1 further comprising a conductive plate that is a separate structure from the structure of the storage elements.

13. The integrated assembly of claim 1 further comprising a conductive plate spaced from the source/drain regions.

14. The integrated assembly of claim 1 wherein the storage elements are spaced from the source/drain regions.

15. An integrated assembly, comprising:
   a memory array over a base; the memory array comprising a three-dimensional arrangement of memory cells;
   sense amplifiers associated with the base and being directly under the memory array;
   vertically-extending digit lines passing through source/drain regions of the memory cells and being coupled with the sense amplifiers;
   a channel region between the source/drain regions and comprising at least two sides, a gate region operatedly adjacent only one side of the channel region;
   wherein each source/drain region comprises an area in a horizontal cross section substantially larger than an area of each digit line in the horizontal cross section; and
   wherein the memory array includes 128 vertically-stacked tiers of the memory cells and wherein the memory array comprises 128 wordlines associated with each of the individual tiers of the memory cells.

16. An integrated assembly, comprising:
   a memory array over a base; the memory array comprising a three-dimensional arrangement of memory cells;
   sense amplifiers associated with the base and being directly under the memory array;
   vertically-extending digit lines passing through source/drain regions of the memory cells and being coupled with the sense amplifiers;
   wherein each source/drain region comprises an area in a horizontal cross section substantially larger than an area of each digit line in the horizontal cross section; and
   wherein the vertically-extending digit lines extend directly through source/drain regions of transistors in the memory cells.

17. The integrated assembly of claim 16 further comprising:
   a conductive plate coupled to the memory cells; and
   storage elements coupled to the memory cells, the storage elements being separate structures from the conductive plate.

18. The integrated assembly of claim 16 further comprising a conductive plate spaced from the source/drain regions having the vertically-extending digit lines.

19. The integrated assembly of claim 16 wherein the storage elements are spaced from the source/drain regions.

20. An integrated assembly, comprising:
   a memory array over a base; the memory array comprising a three-dimensional arrangement of memory cells;
   sense amplifiers associated with the base and being directly under the memory array;
   vertically-extending digit lines passing through source/drain regions of the memory cells and being coupled with the sense amplifiers;
   wherein each source/drain region comprises an area in a horizontal cross section substantially larger than an area of each digit line in the horizontal cross section;
   a conductive plate extending vertically along the three-dimensional arrangement of memory cells; and
   storage elements coupled with the memory cells, the storage elements being separate structures from the conductive plate.

21. The integrated assembly of claim 20 wherein the conductive plate is configured to drain excess carriers from the channel regions of transistors.

22. The integrated assembly of claim 20 wherein the conductive plate is spaced from the source/drain regions.

23. The integrated assembly of claim 20 further comprising storage elements that are spaced from the source/drain regions.

24. An integrated assembly, comprising:
   a memory array over a base; the memory array comprising a three-dimensional arrangement of memory cells;
   sense amplifiers associated with the base and being directly under the memory array;

vertically-extending digit lines passing through source/drain regions of the memory cells and being coupled with the sense amplifiers;

wherein each source/drain region comprises an area in a horizontal cross section substantially larger than an area of each digit line in the horizontal cross section; and wherein an entirety of the structure for the vertically-extending digit lines extend only vertically.

25. The integrated assembly of claim 24 further comprising;
a conductive plate; and
storage elements that are separate structures from the conductive plate.

26. The integrated assembly of claim 24 further comprising a conductive plate spaced from the source/drain regions.

27. The integrated assembly of claim 24 further comprising storage elements that are spaced from the source/drain regions.

28. An integrated assembly, comprising:
a memory array over a base; the memory array comprising a three-dimensional arrangement of memory cells;
sense amplifiers associated with the base and being directly under the memory array;
vertically-extending digit lines passing through source/drain regions of the memory cells and being coupled with the sense amplifiers;
wherein each source/drain region comprises an area in a horizontal cross section substantially larger than an area of each digit line in the horizontal cross section; and
wherein the digit lines are subdivided amongst comparative sets, with each of the comparative sets comprising a first comparative digit line and a second comparative digit line comparatively coupled to the first comparative digit line through one of the sense amplifiers.

29. The integrated assembly of claim 28 wherein multiple of the comparative sets of the digit lines are coupled with a single one of the sense amplifiers.

30. The integrated assembly of claim 28 further comprising;
a conductive plate; and
storage elements that are separate structures from the conductive plate.

31. The integrated assembly of claim 28 further comprising a conductive plate spaced from the source/drain regions.

32. The integrated assembly of claim 28 further comprising storage elements that are spaced from the source/drain regions.

33. An integrated assembly, comprising:
a memory array over a base; the memory array comprising a three-dimensional arrangement of memory cells;
sense amplifiers associated with the base and being directly under the memory array;
vertically-extending digit lines passing through source/drain regions of the memory cells and being coupled with the sense amplifiers;
a channel region between the source/drain regions and comprising at least two sides, a gate region operatedly adjacent only one side of the channel region;
wherein each source/drain region comprises an area in a horizontal cross section substantially larger than an area of each digit line in the horizontal cross section;
wherein the memory cells include horizontally-extending access devices coupled with storage elements; and
wherein the memory array includes 128 vertically-stacked tiers of the memory cells and wherein the memory array comprises 128 wordlines associated with each of the individual tiers of the memory cells.

* * * * *